United States Patent [19]

Paoli

[11] Patent Number: 5,287,376
[45] Date of Patent: Feb. 15, 1994

[54] INDEPENDENTLY ADDRESSABLE SEMICONDUCTOR DIODE LASERS WITH INTEGRAL LOWLOSS PASSIVE WAVEGUIDES

[75] Inventor: Thomas L. Paoli, Los Altos, Calif.

[73] Assignee: Xerox Corporation, Stamford, Conn.

[21] Appl. No.: 990,135

[22] Filed: Dec. 14, 1992

[51] Int. Cl.⁵ .................................................. H01S 3/19
[52] U.S. Cl. ........................................ 372/43; 372/50; 385/14
[58] Field of Search ................. 372/43, 50; 385/14, 385/122, 129, 130, 131, 132, 50

[56] References Cited

U.S. PATENT DOCUMENTS

| | | | |
|---|---|---|---|
| 4,369,513 | 1/1983 | Umeda et al. | 372/46 |
| 4,594,718 | 6/1986 | Scifries et al. | 372/45 |
| 4,689,797 | 8/1987 | Olshansky | 372/45 |
| 4,694,459 | 9/1987 | Burnham et al. | 372/45 |
| 4,760,580 | 7/1988 | Thompson et al. | 372/50 |
| 4,802,182 | 1/1989 | Thornton et al. | 372/50 |
| 4,901,329 | 2/1990 | Leas | 372/50 |
| 5,159,604 | 10/1992 | Mehuys et al. | 372/50 |
| 5,179,604 | 1/1993 | Yanagawa et al. | 385/24 |

Primary Examiner—Frank Gonzalez
Attorney, Agent, or Firm—William Propp

[57] ABSTRACT

Within a monolithic semiconductor structure, passive waveguides couple laterally offset generation waveguides for generating light waves to mirrors. The passive waveguides can also couple detecting regions for measuring the light intensity within the laser cavity and adjustable absorption regions for tuning the wavelength of the lightwaves generated by the generation waveguides.

15 Claims, 7 Drawing Sheets

INDEPENDENTLY ADDRESSABLE SEMICONDUCTOR DIODE LASERS WITH INTEGRAL LOWLOSS PASSIVE WAVEGUIDES

BACKGROUND OF THE INVENTION

This invention relates to independently addressable semiconductor diode lasers, and, more particularly, to low-loss passive waveguides integrally connected to the localized optical gain active regions of the semiconductor diode lasers.

Monolithic arrays of independently addressable semiconductor diode lasers are the optical sources of choice for high-speed, high-resolution xerographic printers and optical storage systems.

However, independently addressable laser arrays within a monolithic semiconductor structure present several problems.

Increasing the number of laser emitters within the monolithic semiconductor structure decreases the spacing between adjacent laser emitters. This decreased spacing may cause crosstalk between adjacent laser emitters.

The area on the surface of the monolithic semiconductor structure is limited for the number of contacts for the emitters and may require complicated crossover contacting patterns.

Since the area on the surface of the monolithic semiconductor structure is limited and since the volume within the monolithic semiconductor structure is also limited, the addition of detectors to monitor the level of emitted light from each semiconductor diode laser will further decrease the number of contacts on the surface available for laser emitters within the monolithic semiconductor structure.

It is difficult to configure the optical gain active regions of the semiconductor diode lasers within the monolithic semiconductor structure so each will emit light at a different wavelength or so adjacent emitters will emit light to partially overlap without introducing optical interference.

It is an object of this invention to provide an increased density of independently addressable semiconductor diode laser emitters within a monolithic semiconductor structure.

It is another object of this invention to reduce crosstalk between adjacent semiconductor diode laser emitters within a monolithic semiconductor structure.

It is yet another object of this invention to provide a separately addressable monitoring detector incorporated on the axis of each semiconductor diode laser emitter with inherent discrimination against light spontaneously emitted by the emitter's optical gain active region.

It is another object of this invention to provide semiconductor diode laser emitters within a monolithic semiconductor structure to emit light at a different wavelength or adjacent laser emitters to emit light to partially overlap without introducing optical interference.

SUMMARY OF THE INVENTION

In accordance with the present invention, within a monolithic semiconductor structure, passive waveguides couple laterally offset generation waveguides for generating light waves to mirrors. The passive waveguides can also couple detecting regions for adjusting the gain within the generation waveguides and adjustable absorption regions for tuning the wavelength of the light waves to the generation waveguides.

Electrically passive transparent optical waveguides are used to interconnect spatially limited coaxial regions of gain and loss between the mirrors of individual lasers in a monolithic array of independently addressable diode lasers. One or more spatially limited regions are used to provide the optical gain required to produce lasing operation of each laser in the array. A spatially distinct and isolated coaxial region is electrically reverse-biased and connected to an external circuit to function as a photodetector to monitor and/or control the intensity of the lasing output. A third spatially distinct and isolated coaxial region with a predetermined length can be included to separately control the wavelength of lasing emission for each laser in the array. Variation of the bias on this wavelength control region from reverse to forward bias is used to further tune the wavelength of lasing emission from the nominal value set by the predetermined length of the control region.

Electrically passive interconnection of functional units within the laser cavity allows the fundamental units to be laterally offset. The lateral offset and passive optical interconnects increases the area for electrical crossover, thereby enabling greatly simplified contacting and an increased density and number of separately addressable units on each chip.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
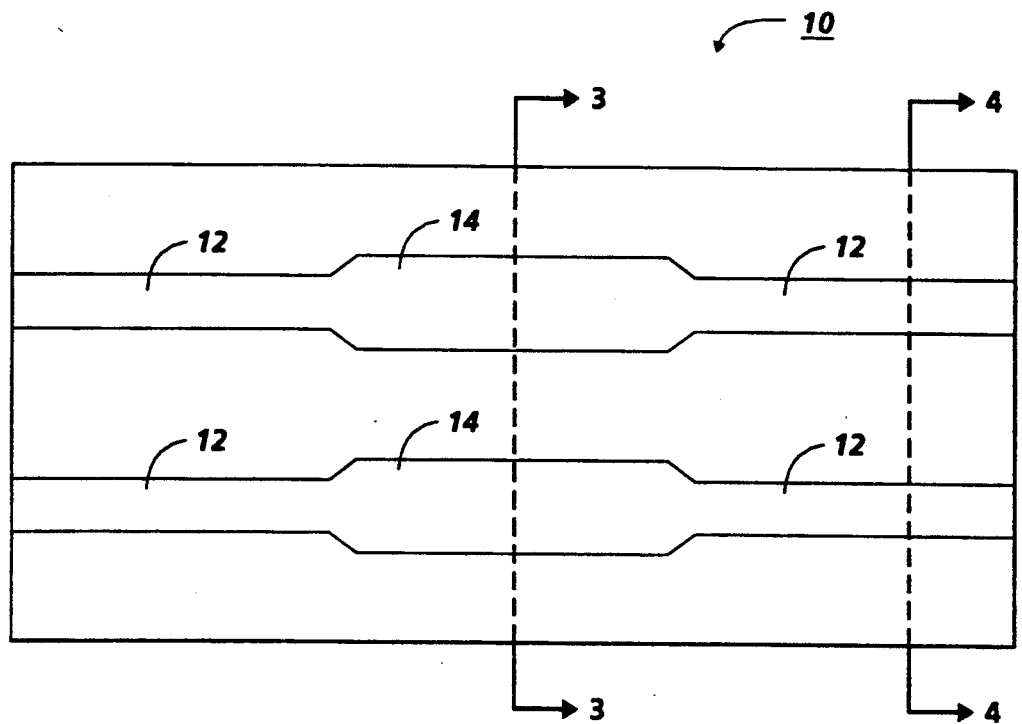
FIG. 1 is a schematic illustration of the cross-section top view of a passive optical waveguide coaxial and coplanar with the active region of a laser emitter within a monolithic semiconductor structure formed according to the present invention.

Reference is now made to FIG. 1, wherein there is illustrated a monolithic semiconductor structure 10 wherein a passive optical waveguide 12 which is coaxial and coplanar with the active region 14 of a laser emitter or generation waveguide. The passive optical waveguide 12 can be formed integrally with the active region 14 of a laser emitter or generation waveguide within the monolithic semiconductor structure.

Figure 2:
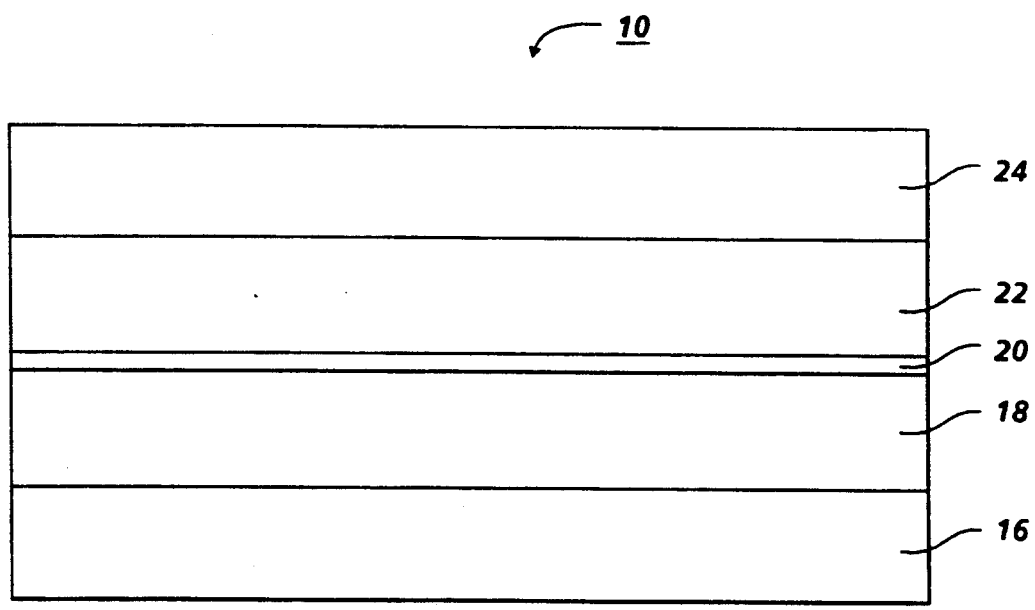
FIG. 2 is a schematic illustration of the cross-sectional end view of the monolithic semiconductor structure of FIG. 1 before forming of the passive optical waveguide and the active region of a laser emitter according to the present invention.

As shown in FIG. 2, the semiconductor structure 10 comprises a substrate 16 of n-GaAs upon which is epitaxially deposited a first cladding layer 18 of n-$Al_yGa_{1-y}As$ wherein $y \geq 0.40$; an active layer 20 of multiple quantum wells of four 12 nm quantum wells of $Ga_{1-x}Al_xAs$, wherein $x = 0.05$, separated by three 6 nm barriers of $Ga_{1-z}Al_zAs$, wherein $z = 0.20$, a second cladding layer 22 of p-$Al_yGa_{1-y}As$ wherein $y \geq 0.40$, and a cap layer 24 of p+GaAs. This monolithic semiconductor structure is a semiconductor heterostructure since the layers within the structure are different semiconductor materials.

The active layer 20 may, in the alternative, be non-doped or p-type doped or n-type doped; GaAs, $Al_zGa_{1-z}As$ where $y > z$ or $(Al_zGa_{1-z})_{0.5}In_{0.5}P$; or a relatively thin conventional double heterostructure (DH) active layer; or a single quantum well, such as GaAs or $Al_zGa_{1-z}As$ where $z < y$; or a multiple quantum well superlattice, such as alternating layers of GaAs and $Al_zGa_{1-z}As$ where $z < y$ or alternating layers of $Al_wGa_{1-w}As$ and $Al_BGa_{1-B}As$ where $w < B < y$ (w for well and B for barrier). Also, in the alternative, any of the aforementioned active layers can be deposited between two semiconductor confinement layers of $Al_mGa_{1-m}As$ and $Al_nGa_{1-n}As$, where m= or $\neq$n, but with the bandgaps intermediate between the bandgaps of the active layer and the first and second cladding layers, in a separate confinement structure.

As is known in the art, the epitaxial growth of the semiconductor structure 10 may be carried out by molecular beam epitaxy (MBE) or metalorganic chemical vapor deposition (MOCVD). The substrate 16 may be about 100 microns thick. The cladding layers 18 and 22 may have a thickness in the range of 0.1 to 1 micron. The active layer 20 may be a thin conventional layer having a thickness of 50 nanometers to 2 microns or may be comprised of a superlattice structure of quantum wells which may be 3 to 50 nanometers thick. This active region 20 of multiple quantum wells has a thickness of approximately 66 nm. The cap layer 24 is typically 0.1 to 0.2 microns thick.

There are several conventional techniques for forming the passive optical waveguide integral with the generation waveguide of a laser emitter within the active layer 20. Discussion hereafter will be confined to impurity induced layer disordering and laser-patterned desorption. However, it should be noted that these other techniques and elemental diffusions or implants are equally applicable.

For example, upon completion of the epitaxial growth, masks of $Si_3N_4$ are formed on the top surface of the cap layer 24 of the semiconductor heterostructure 10 with openings exposing regions of the semiconductor structure to impurity induced layer disordering as disclosed in U.S. Pat. No. 4,802,182 to Thorton et al. which is commonly assigned to the same assignee as the present application and is hereby incorporated by reference. The masks protect the unexposed regions which will form and shape the generation waveguide and the passive optical waveguides.

The generation waveguide and the passive optical waveguide are established by first selectively diffusing a high concentration n-impurity dopant, such as silicon, into the regions of the semiconductor structure exposed through the mask. Other n-impurity dopant elements would include Ge and Sn.

A silicon layer is deposited in the openings in the $Si_3N_4$ mask and then capped with an additional layer of $Si_3N_4$. The diffusion of silicon is accomplished at a temperature of approximately 800° C. and is maintained for a sufficiently long period of time, e.g. seven to eight hours, to penetrate the cap layer 24, the second cladding layer 22 and the active layer 20, and partially penetrate the first cladding layer 18.

Figure 3:
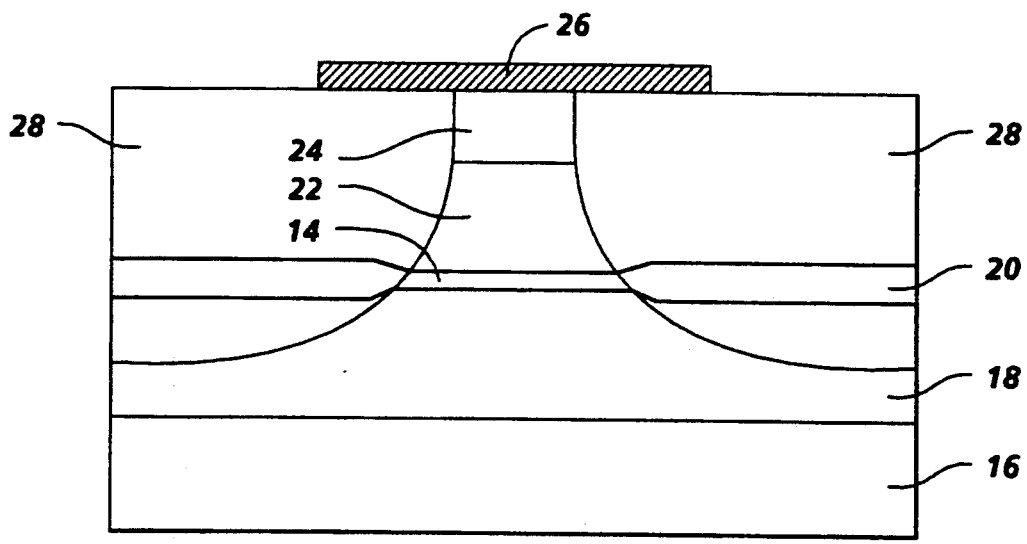
FIG. 3 is a schematic illustration of the cross-sectional end view of the monolithic semiconductor structure with buried planar active region along the line 3—3 in FIG. 1 after selective impurity induced layer disordering formed according to the present invention.
Figure 4:
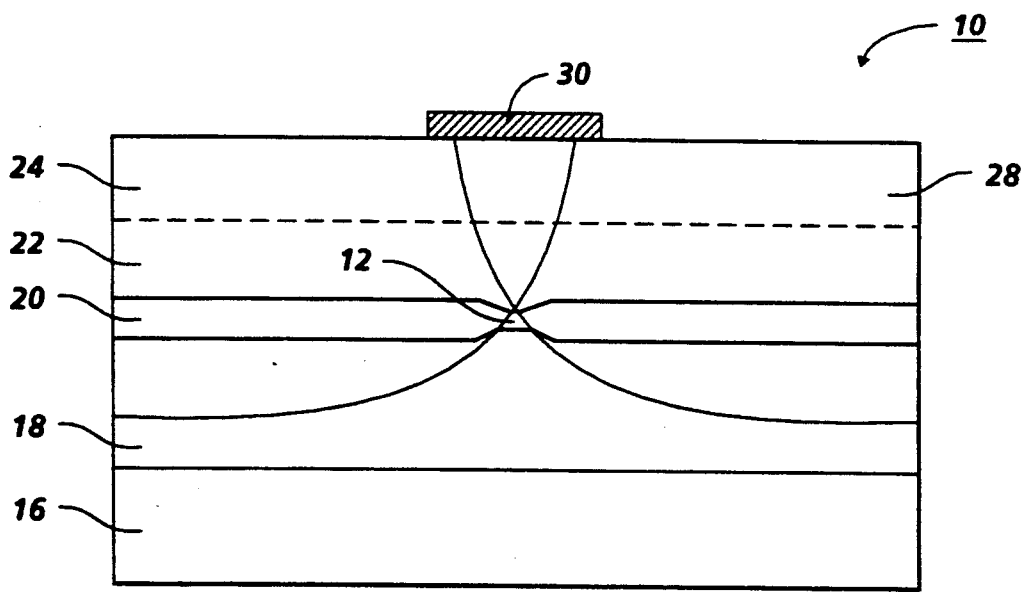
FIG. 4 is a schematic illustration of the cross-sectional end view of the semiconductor heterostructure with buried planar passive optical waveguides along the line 4—4 in FIG. 1 after selective impurity induced layer disordering formed according to the present invention.

The diffusion of silicon through and into the active layer 20, the cap layer 24 and the cladding layers 18 and 22 causes an intermixing of Ga and Al in the active layer 20, the cap layer 24 and the cladding layers 18 and 22, thereby forming n-impurity induced disordered regions, as shown in FIGS. 3 and 4.

FIG. 3 is the cross-sectional view of the semiconductor structure 10 along line 3—3 in FIG. 1. A mask 26 which may be typically about 4 μm wide is formed on the top surface of the cap layer 24 of the semiconductor structure 10. The wider mask 26 forms two separate disordered regions 28 after impurity induced layer disordering. Between the disordered regions 28 in the semiconductor structure 10 are the remaining non-disordered regions of the cap layer 24, the second cladding layer 22, the active layer 20 and the first cladding layer 18. The non-disordered region of the active layer 20 between the disordered regions 28 in the semiconductor heterostructure 10 forms the generation waveguide 14 of a laser emitter. The mask 26 is then removed from the surface of the cap layer 24. The disordered regions, optically and electrically, isolate and separate the generation waveguide of the laser emitter or generation waveguide of the semiconductor heterostructure. The active regions or generation waveguides are shaped by the cladding layers in the vertical direction and the shape of the disordered regions in the horizontal direction.

FIG. 4 is the cross-sectional view of the semiconductor structure 10 along line 4—4 in FIG. 1. A mask 30 which may be typically about 2 μm wide is formed on the top surface of the cap layer 24 of the semiconductor heterostructure 10. The narrower mask 30 forms two overlapping disordered regions 28 after impurity induced disordering. The cap layer 24 and the second cladding layer 22 will be completely disordered with the disordered region 28 in the semiconductor structure 10 encompassing the regions of the cap layer 24 and the second cladding layer 22. Between the disordered regions 28 in the semiconductor structure 10 are the active layer 20 and the first cladding layer 18. The active layer will be initially or partially disordered. The partially disordered region of the active layer 20 between the disordered regions 28 in the semiconductor heterostructure 10 forms the passive optical waveguide 12. The mask 30 is then removed from the surface of the cap layer 24. The disordered regions, optically and electrically, isolate and separate the passive optical waveguide of the semiconductor heterostructure. The passive optical waveguides are shaped by the partially disordered second cladding layer and the first cladding layer in the vertical direction and the shape of the disordered regions in the horizontal direction.

As noted in these particular examples, mask portion 26 may be typically about 4 um wide and mask 30 may be typically 2 um wide. The two masks 26 and 30 may be deposited on the surface of the cap layer at the same time and the two masks may be removed from the surface of the cap layer at the same time. The impurity induced layer disordering to form the generation waveguide and the passive optical waveguide may also be done at the same time. The wider dimension of mask 26 determines the width of the generation waveguide 14 and the narrower dimension of mask 30 is sufficiently narrow to achieve some degree of impurity induced layer disordering substantially into if not through its generation waveguide portion beneath the mask for the passive waveguide. The central core of the generation waveguide 14 underneath mask 26 is less completely interdiffused by the impurity induced layer disordering process as compared to the adjacent disordered regions of the active layer of the passive waveguide 12 not fully protected by mask 30.

An alternate technique of forming the passive optical waveguide integral with the generation waveguide of a laser emitter within the active layer 20 of a monolithic semiconductor structure 10 is by using laser-patterned desorption as disclosed in U.S. Pat. No. 4,962,057 to Epler et al. which is commonly assigned to the same assignee as the present application and is hereby incorporated by reference. The passive optical waveguide 12 and the generation waveguide 14 of a laser emitter are fabricated by a tightly focussed beam scanned across the surface of the active layer 20 with changing dwell time.

Figure 5:
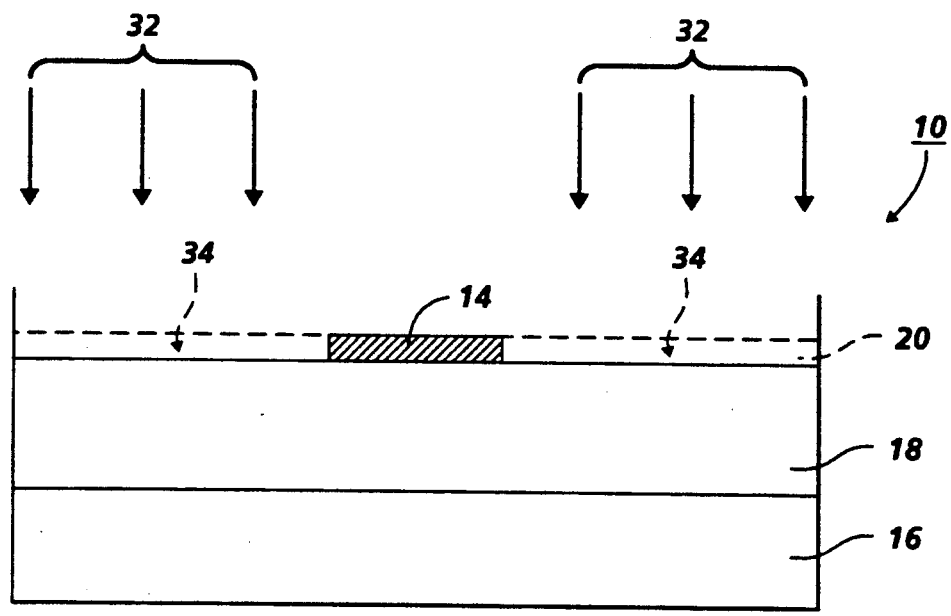
FIG. 5 is a schematic illustration of the cross-sectional end view of the monolithic semiconductor structure before forming of the active region of a laser emitter by laser-patterned desorption according to the present invention.

After deposition of the substrate 16 and the first cladding layer 18, and upon completion of the deposition of the active quantum well layer 20 in FIG. 5, epitaxial deposition and growth is temporally discontinued, and as taught in U.S. Pat. No. 4,962,057, the trimethyl-gallium (TMG) source to the MOCVD chamber is turned off, the substrate temperature is increased to about 825° C. and a laser beam 32 or combination laser beam is focussed on the surface of the active layer 20 for a period of time sufficient to thermally evaporate the active layer 20 at regions 34 to the surface of the first cladding layer 18 at a rate of 1 angstrom per second.

By controlling the illumination intensity, the angle and the length of exposure of the laser beam 32, the areas 34 of the active layer 20 are desorbed down to the interface with the first cladding layer 18 resulting in an generation waveguide 14 being formed on the surface of the first cladding layer 18 from the non-illuminated portion of the active layer 20. The $Al_yGa_{1-y}As$ of the first cladding layer 18 functions as a stop to the optically induced desorption because $Al_yGa_{1-y}As$ where $y \geq 0.15$ is much more difficult to desorb according to this process as compared to the desorption of the GaAs of the active quantum well layer 20.

Also, the operating temperature for AlGaAs will be higher than that for GaAs because the Al content in AlGaAs causes a slower evaporation rate since GaAs has a higher vapor pressure than AlGaAs.

The method of U.S. Pat. No. 4,962,057 allows growth of the active layer to be performed at a temperature that optimizes the quality of the layer for laser desorption. The desorption can subsequently be accomplished at a base temperature conducive to the preferential thinning of the regions 34 of the active layer 20 relative to the generation waveguide 14. The laser approach to the desorption is preferable to the simple raising of the temperature of the substrate to induce desorption because the intensity of the optical illumination allows for shaping of the resulting generation waveguide, faster control of the semiconductor temperature, shorter desorption times, and less time spent at high undesired temperatures. All of these factors greatly enhance the reproducibility of the process using optical illumination.

Figure 6:
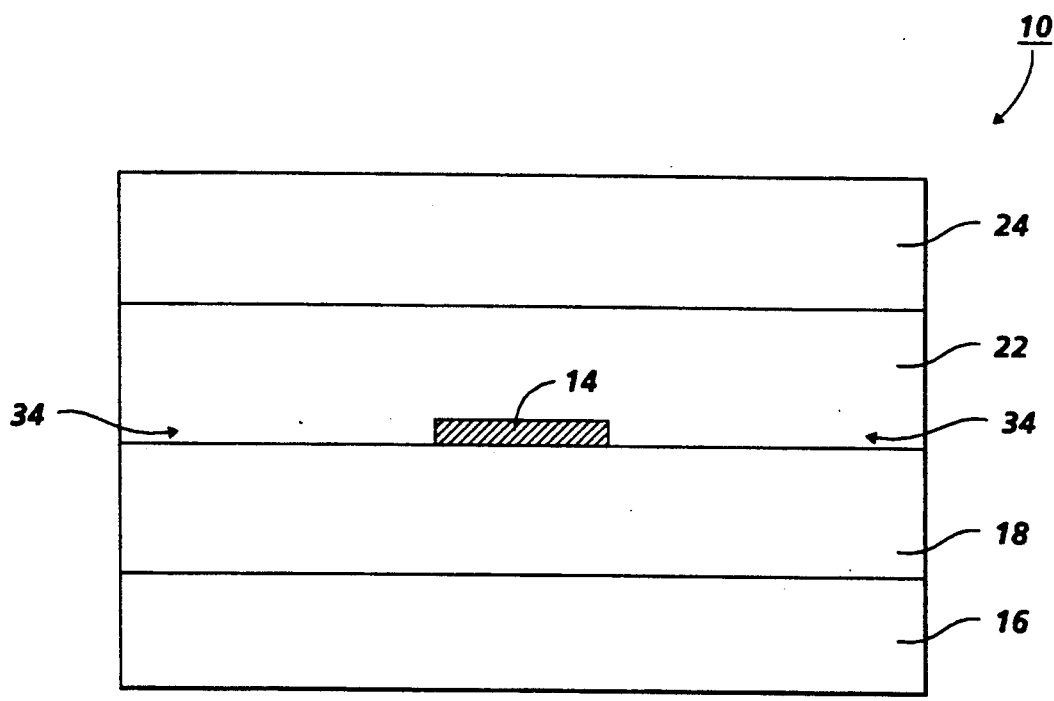
FIG. 6 is a schematic illustration of the cross-sectional end view of the monolithic semiconductor structure with buried planar active region in FIG. 5 after laser-patterned desorption formed according to the present invention.

As shown in FIG. 6, after photo-induced desorption, the generation waveguide 14 has formed on the surface of the first cladding layer 18 with no active layer 20 in the regions 34 on the surface of the first cladding layer 18. Epitaxial growth of semiconductor laser structure 10 is then continued with the growth of the second cladding layer 22 and the cap layer 24. Each of these layers provides a uniform thickness on top of the previous semiconductor layers. A buried heterostructure laser formed with no active layer on the sides is preferred but an active rib guide is also possible.

The passive optical waveguides 12 can be formed by the same laser-patterned desorption method as the generation waveguide in FIGS. 5 and 6.

Figure 7:
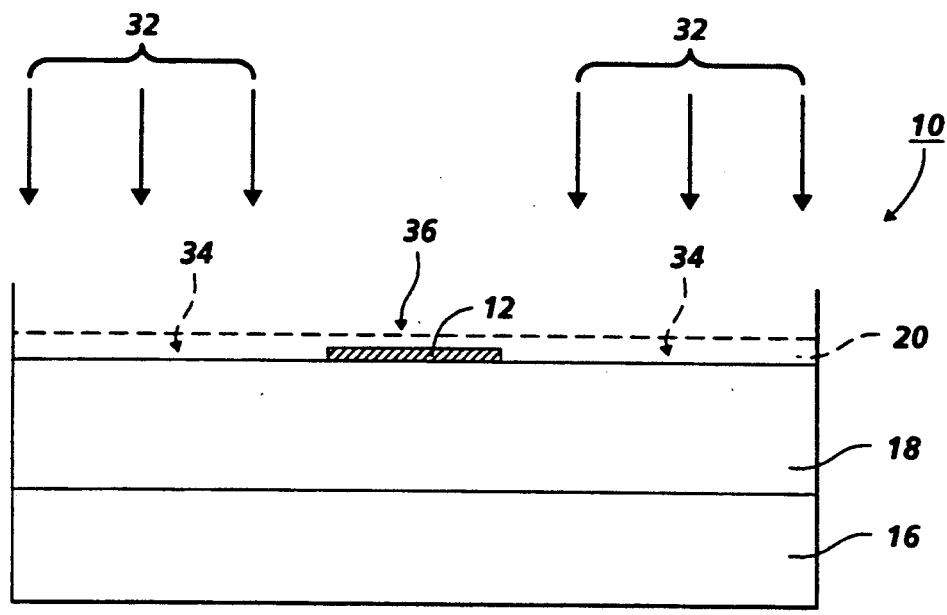
FIG. 7 is a schematic illustration of the cross-sectional end view of the monolithic semiconductor structure before forming of the passive optical waveguide by laser-patterned desorption according to the present invention.

After deposition of the first cladding layer 18 on the substrate 16, and upon completion of the deposition of the active quantum well layer 20 in FIG. 7, epitaxial deposition and growth is temporally discontinued, and as taught in U.S. Pat. No. 4,962,057, a laser beam 32 or combination laser beam is focussed on the surface of the active layer 20 for a period of time sufficient to thermally evaporate the active layer 20 at regions 34 and 36.

By controlling the illumination intensity, the angle and the length of exposure of the laser beam 32, the areas 34 of the active layer 20 are desorbed down to the interface with the first cladding layer 18. The area 36 of the active layer 20 is only partially desorbed by the laser illumination resulting in a passive optical waveguide 12 being formed on the surface of the first cladding layer 18 from the partially illuminated portion on the active layer 20. The partial desorption of the active layer 20 thins the active quantum well sufficiently to raise its energy bandgap by the quantum size effect and thereby make the active layer 20 transparent to radiation generated in the generation waveguide 14.

Figure 8:
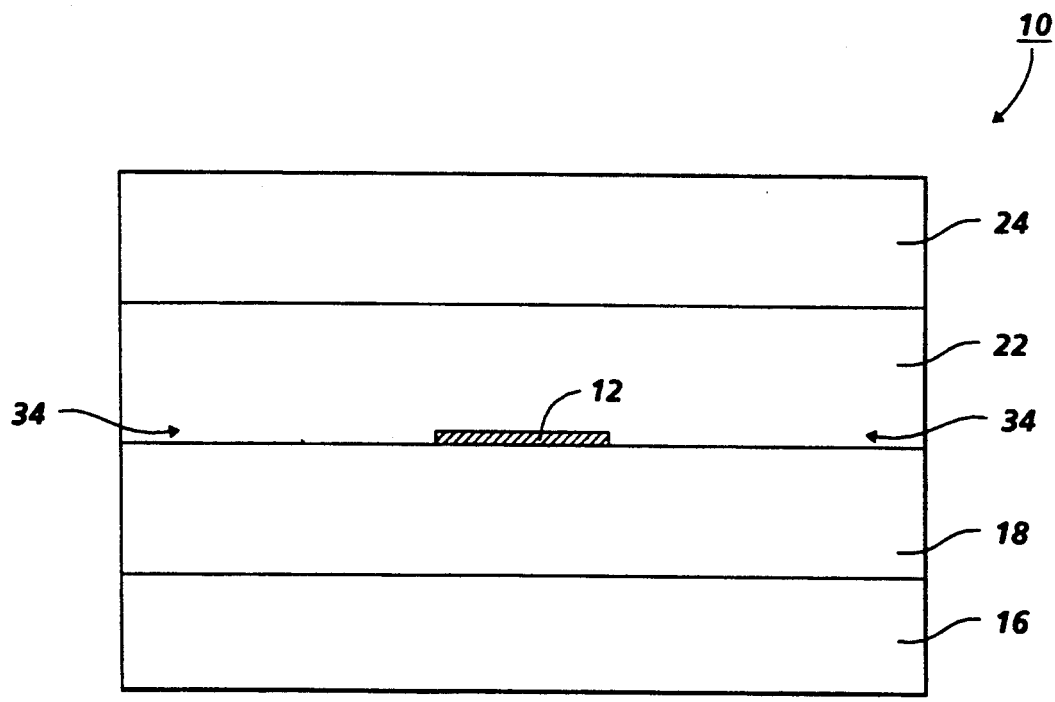
FIG. 8 is a schematic illustration of the cross-sectional end view of the monolithic semiconductor structure with buried planar passive optical waveguide in FIG. 7 after laser-patterned desorption formed according to the present invention.

As shown in FIG. 8, after photo-induced desorption, the passive optical waveguide 12 has formed on the surface of the first cladding layer 18 with no active layer 20 in the regions 34 on the surface of the first cladding layer 18. Epitaxial growth of semiconductor laser structure 10 is then continued with the growth of the second cladding layer 22 and the cap layer 24. Each of these layers provides a uniform thickness on top of the previous semiconductor layers.

The passive waveguides 12 formed by the impurity induced layer disordering of FIG. 4 are narrower with an increased bandgap than the generation waveguides formed by the impurity induced disordering of FIG. 3. The passive waveguides formed by the laser-patterned desorption of FIGS. 7 and 8 are the same width or narrower and thinner in height with an increased bandgap than the generation waveguides formed by the laser-patterned desorption of FIGS. 5 and 6.

The passive waveguides 12 are unique in that they can be fabricated in a monolithic and planar fashion and provide subsurface passive optical waveguide structures that are easily made coplanar and coaxial with buried subsurface generation waveguides for laser emitters. Semiconductor structures incorporating these two dimensional passive optical waveguides are of great interest in monolithic integration of optical and electronic components on a single chip.

The generation waveguides 14 of the laser emitter and the passive optical waveguides 12 have a higher index of refraction than the neighboring areas of active layer 20 and a higher index of refraction than cladding layers 18 and 22. Thus, the light generated in the generation waveguides 14 and transmitted by the low-loss parallel passive optical waveguides 12 is confined by the well-known phenomena of total internal reflection within the active layer 20 of the monolithic semiconductor structure.

The passive optical waveguides 12 are integrally formed in the active layer and have an energy bandgap greater than the energy of the generated lightwaves so that the coupling structure is nearly transparent to the lightwaves generated by the generation waveguides and does not need to be forward-biased to transmit the lightwaves. These transparent passive optical waveguides 12 can be narrower or thinner than the generation waveguides 14. The cap layer surface above the passive waveguides can be proton bombarded to render this region insulating and therefore not electrically pumped.

The diffraction and scattering losses within the two-dimensional passive optical waveguide are low. The propagation loss along the two-dimensional passive optical waveguide is also low due to its increased bandgap.

Contacts can be formed on opposites side of the monolithic semiconductor structure 10 on the cap layer 24 and the substrate 16. Standard masking means or other techniques can be employed to form metal contacts of Cr-Au or Ti-Pt-Au or Au-Ge.

Current is injected between the cap layer contact and the substrate contact to forward-bias the p-n junction of p-cladding layer 22 and n-cladding layer 18 to cause the generation waveguide 14 of the laser emitter to emit coherent light of a single wavelength.

For the generation waveguides of the laser emitters, the current is injected substantially perpendicular to the generation waveguide 32, through the cap layer contact, the p-cap layer 24, the p-cladding layer 22, the generation waveguide 14, and then spreads in the n-cladding layer 18 into the substrate 16 and out the substrate contact. Regions 28 can be proton bombarded if needed to confine the current to the generation waveguides and to isolate the contact from underlying disordered regions.

The ground or substrate contact can be common to more than one or even all the laser emitters. However, each generation waveguide of each laser emitter contains a p-n junction that is separately biased through its cap layer contact from all the others. Since each generation waveguide of each laser emitter is positively biased with respect to ground, current flows only from each cap layer contact to ground.

The passive optical waveguides do not emit light nor affect light transmission when a current is applied through the laser regions. The optical waveguide 12 is not forward-biased and thus functions as a passive element. No contacts are formed on the surfaces of the semiconductor structure 10 for the passive optical waveguides 12.

The initial or partial disordering of the active layer 20 or the thinning of the active layer 20 by desorption will make the passive optical waveguide 12 transparent to radiation generated elsewhere in the active layer 20, i.e. the passive waveguide 12 will be nonabsorbing of the radiation at the operating wavelength of the generation waveguide 14 of the laser emitter.

Thus, a separate contact on the surface of the cap layer above each generation waveguide allows each laser emitter in an array within the monolithic semiconductor structure to be independently and individually addressable.

Figure 9:
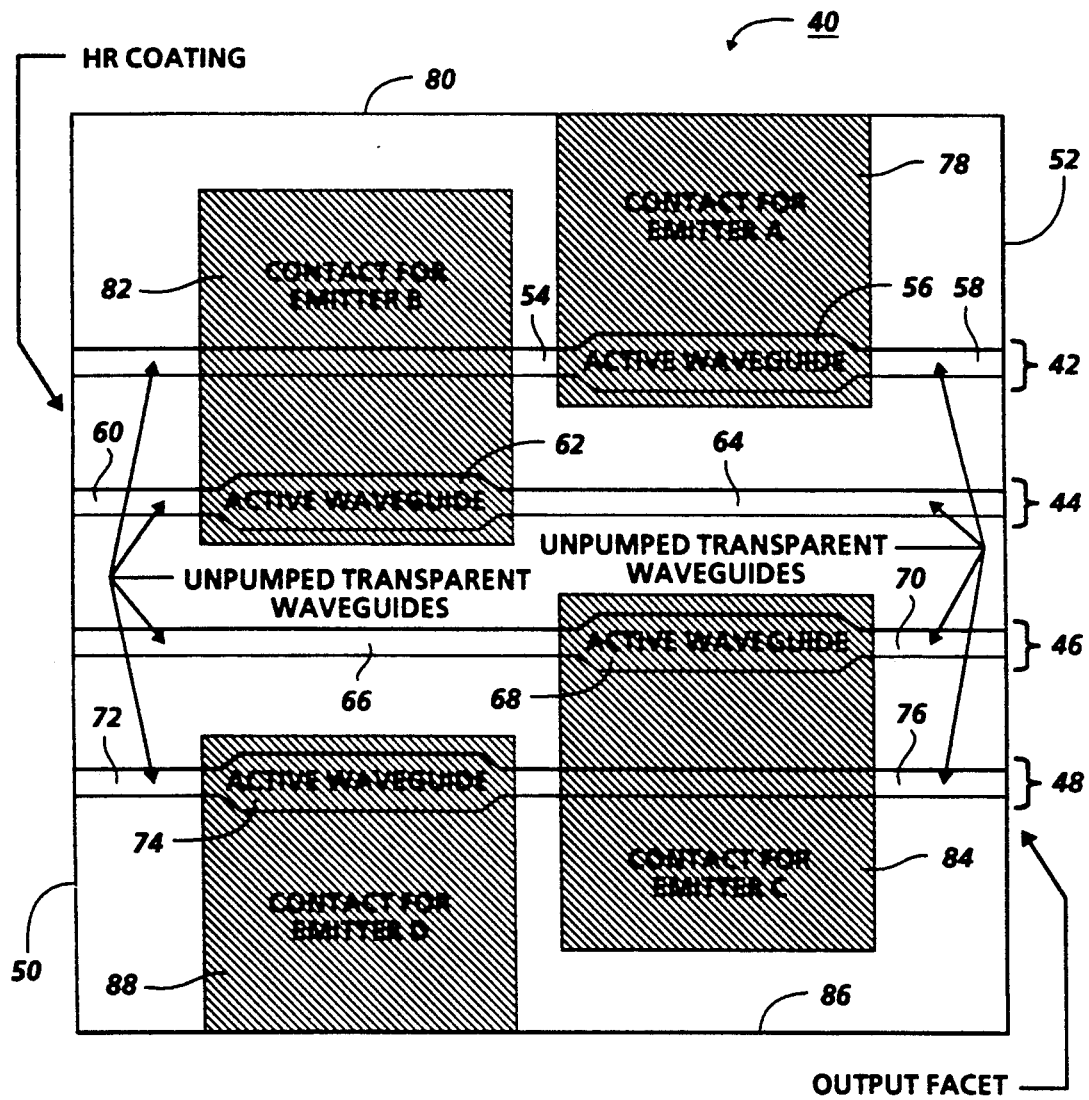
FIG. 9 is a schematic illustration of the cross-section top view of an array of laser emitters with passive optical waveguides coaxial and coplanar with the active regions of the laser emitters within a monolithic semiconductor structure formed according to the present invention.

The contacts in FIG. 9 extend perpendicular along the surface of the cap layer 24 of the monolithic semiconductor structure 40 to above the buried generation waveguides connected to the buried passive optical waveguides.

Four diode lasers 42, 44, 46 and 48, buried within the monolithic semiconductor structure 40, extend perpendicularly from the highly reflective mirror 50 on one side of the semiconductor structure 40 to the output mirror 52 on the other side of the semiconductor structure 40. The output mirror 52 is less reflective than the highly reflective mirror 50 so that light emitted from the generation waveguides of the laser emitters will be transmitted through the output mirror. The highly reflective mirror and output mirror are on opposing sides of the semiconductor heterostructure and perpendicular to the semiconductor layers, including the active layer in the heterostructure.

The generation waveguide in each laser emitter is restricted to a small portion of the emitter's axial length while the remainder of the length is a passive optical waveguide. For the purposes of an illustrative example, the laser emitters of FIG. 9 are formed by impurity induced disordering with the resulting wide generation waveguides and narrow passive waveguides.

The first laser emitter 42 consists of a long passive optical waveguide 54, extending from the mirror 50, which is coaxial, coplanar and optically connected to an generation waveguide 56 of a laser emitter which is coaxial, coplanar and optically connected to a short passive optical waveguide 58, extending to the mirror 52. The second laser emitter 44 consists of a short passive optical waveguide 60, extending from the mirror 50, which is coaxial, coplanar and optically connected to an generation waveguide 62 of a laser emitter which is coaxial, coplanar and optically connected to a long passive optical waveguide 64, extending to the mirror 52.

The third laser emitter 46 consists of a long passive optical waveguide 66, extending from the mirror 50, which is coaxial, coplanar and optically connected to an generation waveguide 68 of a laser emitter which is coaxial, coplanar and optically connected to a short passive optical waveguide 70, extending to the mirror 52. The fourth laser emitter 48 consists of a short passive optical waveguide 72, extending from the mirror 50, which is coaxial, coplanar and optically connected to an generation waveguide 74 of a laser emitter which is coaxial, coplanar and optically connected to a long passive optical waveguide 76, extending to the mirror 52.

The first contact 78 extends along the surface of the cap layer 38 from a first non-mirrored side 80 of the monolithic semiconductor structure 40 to above the generation waveguide 56 of the first laser emitter 42. The second contact 80 extends along the surface of the cap layer 38 from the first non-mirrored side 80 across and above the long passive optical waveguide 54 of the first laser emitter 42 to above the generation waveguide 62 of the second laser emitter 44.

The third contact 84 extends along the surface of the cap layer 38 from a second non-mirrored side 86 of the monolithic semiconductor structure 40 across and above the long passive optical waveguide 76 of the fourth laser emitter 48 to above the generation waveguide 68 of the third laser emitter 46. The fourth contact 88 extends along the surface of the cap layer 38 from the second non-mirrored side 86 to above the generation waveguide 74 of the fourth laser emitter 48.

The staggering or lateral offset of the generation waveguides of adjacent laser emitters within the monolithic semiconductor structure reduces optical and electrical crosstalk between adjacent generation waveguides by further separating the adjacent generation waveguides. This increased axial separation between adjacent generation waveguides also prevents the spontaneous emission of light and the spontaneous flow of current between adjacent generation waveguides.

This increased axial separation between adjacent generation waveguides allows for close spacing of adjacent emitters. Each narrow passive optical waveguide allows the lasing mode to spread beyond the size determined by the generation waveguides in each laser emitter. Intensity profiles of emitted light from adjacent emitters can thereby be made to partially overlap without introducing optical interference.

Some generation waveguides could be formed at the mirrors but symmetrical placement of the generation waveguides with respect to the passive waveguides is probably most desirable if it is important for the thresholds of all the laser emitters to be nearly the same. The threshold current of each emitter can be significantly reduced by optimizing the length of the generation waveguide for the low threshold active layer composed of a single quantum well. This threshold reduction lowers the thermal crosstalk among all laser emitters in the array. The area available for electrical contact crossovers is greatly increased, thereby allowing simplified contacting and an increased number of emitters.

In the case of wide planar generation waveguides and narrow planar passive optical waveguides, such as those formed by impurity induced layer disordering, the staggering of the generation waveguides and the alternating of generation waveguides and passive optical waveguides from adjacent laser emitters provides a higher density of laser emitters within the monolithic semiconductor structure. However, the generation waveguides and the passive waveguides can be the same width or can be narrower when the laser emitter is formed by laser-patterned desorption.

As indicated in FIG. 9, separate contacting of each laser emitter is greatly simplified since the surface area available for crossing over adjacent laser emitters is substantially increased. Consequently, the number of emitters that can be monolithically integrated in this way is limited only by the available semiconductor chip size. The lateral offset or staggering of the buried laser emitters provides contacts for the generation waveguides of interior laser emitters 44 and 46 that need not pass over the generation waveguides of the the exterior laser emitters 42 and 48. The passive waveguides that the contacts pass over do not emit light nor will the contacts affect the propagation of light through the passive waveguides. The contacts will thus only be individually addressable for each laser emitter without causing other laser emitters to emit light.

Figure 10:
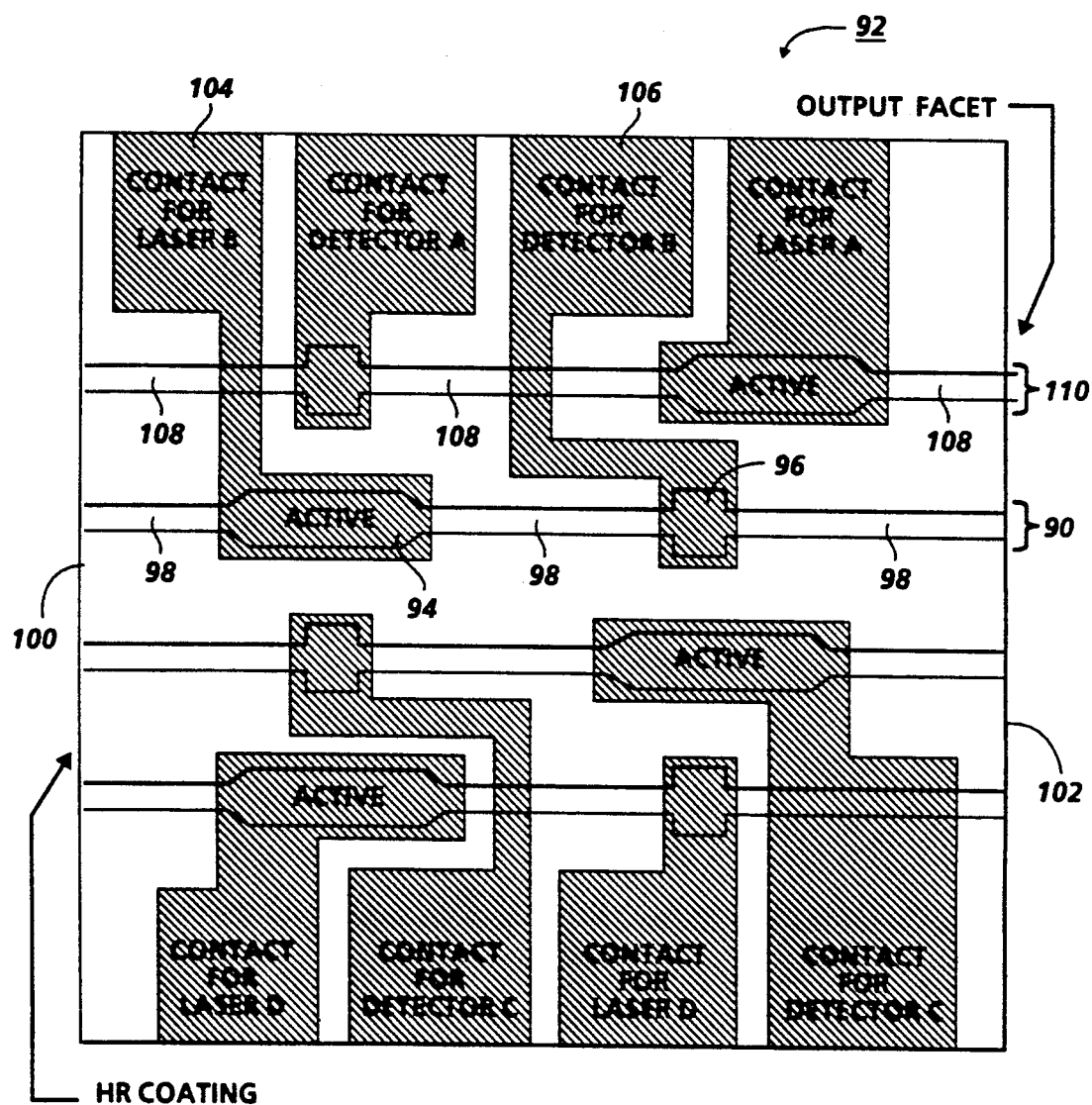
FIG. 10 is a schematic illustration of the cross-section top view of an array of laser emitters with detectors and passive optical waveguides coaxial and coplanar with the active regions of the laser emitters within a monolithic semiconductor structure formed according to the present invention.

The laser emitter 90 in the array in the monolithic semiconductor structure 92 of FIG. 10 has an generation waveguide 94 and a detecting region 96 coaxial and coplanar and optically connected by a passive waveguide 98 which also optically connects the laser emitter to a highly reflective mirror 100 and an output mirror 102. The detecting region 96 is formed in the same manner as the generation waveguide 94 and differs only in its length and bias condition. The bandgap of the detector has not been increased, unlike that of the passive waveguide.

Biasing the detector with a zero voltage or a reverse voltage causes light to be absorbed, thereby producing current in an external circuit. Since the detector is absorptive at the laser wavelength, it can function as an integrated detector to monitor the optical power internal to the laser cavity. The detector can be used in a feedback arrangement to adjust the gain within the laser emitter in the on state to correct for nonuniform lasing or changes in the lasing threshold.

One problem normally encountered with detectors integrated with lasing regions as disclosed in U.S. Pat. No. 5,136,604, commonly assigned as the present application and herein incorporated by reference, is that light spontaneously emitted by the lasing region is absorbed by the detector in addition to the lasing emission. However for the present invention, light that is spontaneously emitted by a gain region is radiated in all directions and not effectively guided to the detector by the integrated waveguide. Thus separation of the detecting and emitting regions effectively discriminates against monitoring the spontaneous emission. A separately addressable monitoring detector incorporated on the axis of each emitter will thus inherently discriminate against light spontaneously emitted by the active gain region of the emitter.

As with the array of laser emitters in the monolithic semiconductor structure of FIG. 9, the generation waveguides and the detectors of adjacent laser emitters in the monolithic semiconductor structure of FIG. 10 are staggered or laterally offset so that the generation waveguide contact 104 and the detector contact 106 of the interior laser emitter 90 will extend across and above the passive waveguide 108 of an exterior laser emitter 110. The use of passive waveguides allows electrical connections and different bias voltages to be applied straightforwardly to the closely-spaced generation waveguides and detectors of the laser emitters in the monolithic semiconductor structure.

Each of the laser emitters in the laser emitter arrays of the monolithic semiconductor structures of FIGS. 9 and 10 can emit light at a different wavelength. Laser-patterned desorption or impurity induced layer disordering can adjust the thickness of the quantum well active layer in each generation waveguide. By altering the thickness of the generation waveguide, the wavelength of the laser emitter will change. Alternately, the length of each generation waveguide can be different in order to vary the carrier density required for lasing threshold. As a result of bandfilling, the wavelength of each emitter will be different.

Figure 11:
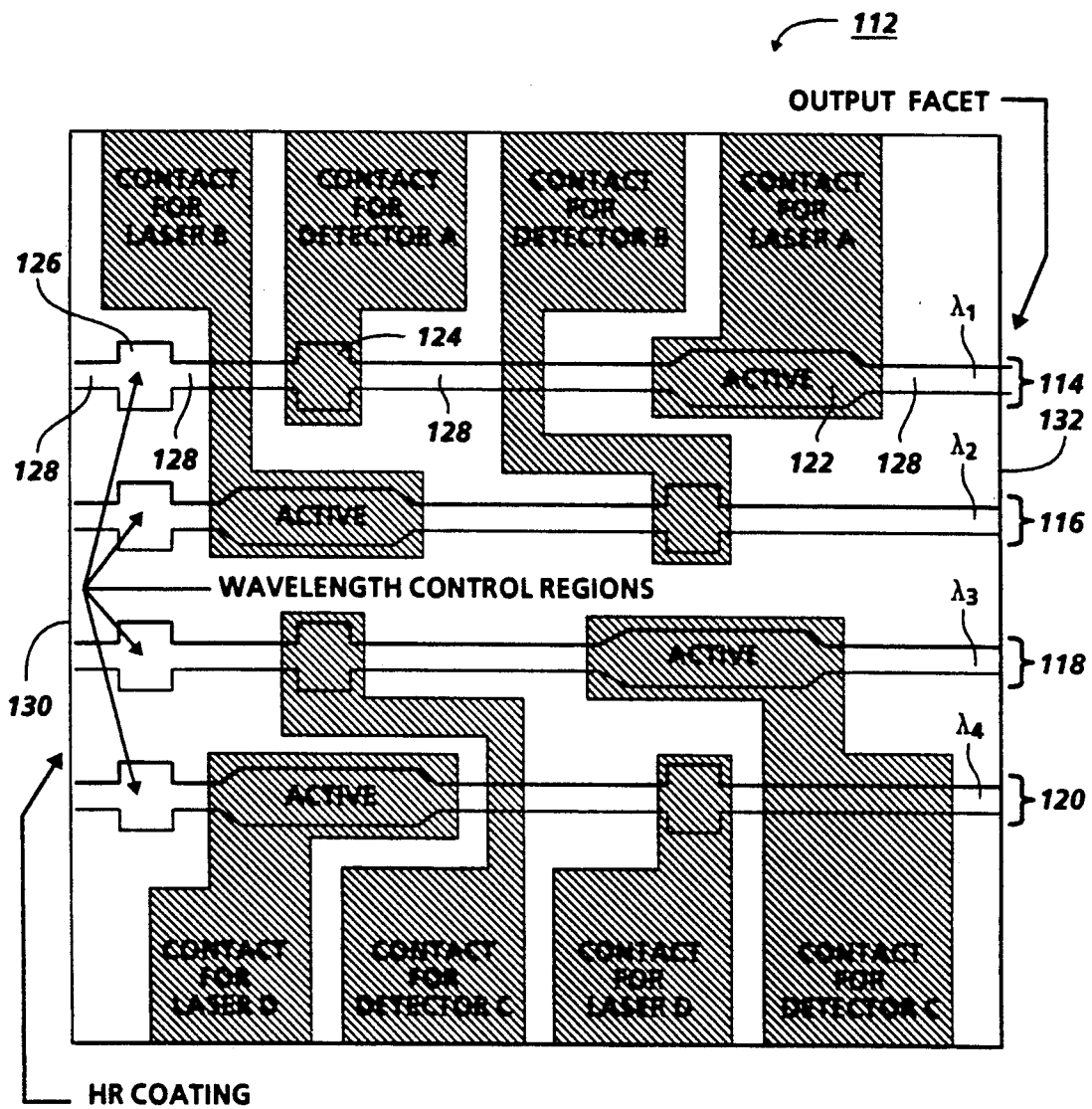
FIG. 11 is a schematic illustration of the cross-section top view of an array of laser emitters with wavelength control regions and passive optical waveguides coaxial and coplanar with the active regions of the laser emitters within a monolithic semiconductor structure formed according to the present invention.

Each emitter can also be made to oscillate at a different wavelength by varying the length or thickness of the generation waveguide of each emitter or by including an unpumped region of a different length in each laser cavity. The monolithic semiconductor structure 112 of FIG. 11 has four laser emitters 114, 116, 118 and 120, each emitting light at a different wavelength. As shown in laser emitter 114, the generation waveguide 122, the detector 124 and an adjustable absorption region 126 coaxial and coplanar and optically connected by a passive waveguide 128, which also optically connects the laser emitter to a highly reflective mirror 130 and an output mirror 132. The adjustable absorption region 126 is formed in the same manner as the generation waveguide 122 and the detector 124 and used as a wavelength selective region. The bandgap of the adjustable absorption region has not been increased, unlike that of the passive waveguide. The adjustable absorption region differs from the detector in its bias condition.

The adjustable absorption region can provide a saturable absorption for tuning the wavelength of the laser emitter. A nominal wavelength selection of each emitter is produced by selecting a different length for the tuning region. Wavelength tuning of each emitter is then produced by varying the bias level on the adjustable absorption region.

Variation of the bias level on adjustable absorption region 126 controls the amount of loss present in the laser cavity from a maximum value $L_{max}$ to a minimum value $L_{min}$. Maximum loss is obtained with adjustable absorption region 126 unbiased (or reverse biased) and results from the intrinsic absorption of the unpumped generation waveguide 122. Minimum loss is obtained with adjustable absorption region 126 forward biased, although the loss may also be negative, i.e., the adjustable absorption region 126 providing gain. With the adjustable absorption region 126 set for minimum loss, generation waveguide 122 is designed to emit at the longest wavelength required. As the tuning current is decreased, loss in the adjustable absorption region 126 is increased and the wavelength shortens. The length of adjustable absorption region 126 is determined by the amount of wavelength shift required. Tuning is discontinuous as the wavelength hops from one longitudinal mode to the next. In addition, the threshold of generation waveguide 122 is increased so that current to the generation waveguide 122 is increased in order to maintain constant power output at the lasing wavelengths. Thus, wavelength switching at constant power is accomplished by simultaneously switching drive currents to both the generation waveguide 122 and the adjustable absorption region 126.

If the adjustable absorption region is uncontacted, the tuning is accomplished by selecting an appropriate length for the adjustable absorption region. However, the adjustable absorption region can be contacted (not shown) in order to adjust the wavelength in operation by partially forward-biasing the adjustable absorption region.

The waveguiding strength of the passive waveguide 34 section and the active layer 24 of section 16 may be varied by changing the time of the impurity induced layer disordering and thereby fine tuning its refractive index properties for preferred modal operation of the active layer 24 and the passive waveguide 34 in FIGS. 1 to 4. Index guiding provides for optical confinement of the beam due to change in the real index of refraction.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A semiconductor laser array comprising:
   a monolithic semiconductor structure having a plurality of semiconductor heterostructure layers disposed over a substrate, at least one of said layers being an active layer for light generation and propagation;
   means, electrically coupled for applying an electrical forward bias to said active layer;
   a first and a second laser mirror disposed at opposing ends of said monolithic semiconductor structure, perpendicular to said plurality of semiconductor heterostructure layers and said active layer, said first and second mirrors defining a resonant laser cavity with optical output from at least one laser mirror;
   a plurality of substantially parallel generation waveguides, disposed in said active layer, with each of said generation waveguides having a predetermined width and length for generating and amplifying lightwaves at a given wavelength in response to said electrical forward bias;
   a first plurality of substantially parallel, low-loss, passive waveguides disposed in said active layer, each passive waveguide oriented co-axially to a corresponding generation waveguide and coextensively coupled at one end to said first laser mirror and at the other end to said corresponding generation waveguide for guiding lightwaves generated and amplified in said generation waveguide;
   and a second plurality of substantially parallel, low-loss, passive waveguides disposed in said active layer, each passive waveguide oriented co-axially to a corresponding generation waveguide and coextensively coupled at one end to said corresponding generation waveguide and at the other end to said second laser mirror for guiding said lightwaves generated and amplified in said corresponding coupled generation waveguide;
   wherein said adjacent generation waveguides are laterally offset within said active layer.

2. The semiconductor laser array of claim 1 wherein said means for applying an electrical forward bias to said active layer may extend above said first and said second plurality of passive waveguides.

3. A semiconductor laser array comprising:
a monolithic semiconductor structure having a plurality of semiconductor heterostructure layers disposed over a substrate, at least one of said layers being an active layer for light generation and propagation;
means, electrically coupled for applying different electrical bias to selected regions of said active layer;
a first and a second laser mirror disposed at opposing ends of said monolithic semiconductor structure, perpendicular to said plurality of semiconductor heterostructure layers and said active layer, said laser mirrors defining a resonant laser cavity with optical output from at least one laser mirror;
a plurality of substantially parallel generation waveguides, disposed in the active layer, with each of said generation waveguides having a predetermined width for generating and amplifying light waves at a given wavelength in response to said electrical forward bias;
a plurality of substantially parallel detecting regions, disposed in the active layer, with each detecting region oriented co-axially to a corresponding generation waveguide, for detecting the light intensity within said laser cavity;
and a plurality of substantially parallel, low-loss, passive waveguides disposed in said active layer, each passive waveguide oriented co-axially to a corresponding generation waveguide and a corresponding detecting region and co-extensively coupled to said first laser mirror, said corresponding generation waveguide, said corresponding detecting region, and said second laser mirror for guiding lightwaves generated and amplified in said corresponding generation waveguide.

4. The semiconductor laser array of claim 3 wherein said adjacent generation waveguides are laterally offset within said active layer and said detecting regions are laterally offset within said active layer.

5. The semiconductor laser array of claim 4, further including means electrically coupled for applying a reverse bias to said adjustable absorption regions.

6. The semiconductor laser array of claim 5 wherein said means for applying forward bias to said generation waveguides and said means for applying reverse bias to said detecting regions may extend above said plurality of passive waveguides.

7. The semiconductor laser array of claim 1 wherein said plurality of generation waveguides generate light waves at a plurality of wavelengths.

8. The semiconductor laser array of claim 3 wherein said plurality of generation waveguides generate light waves at a plurality of wavelengths.

9. A semiconductor laser array comprising:
a monolithic semiconductor structure having a plurality of semiconductor heterostructure layers disposed over a substrate, at least one of said layers being an active layer for light generation and propagation;
means, electrically coupled for applying different electrical bias to selected regions of said active layer;
a first and a second laser mirror disposed at opposing ends of said monolithic semiconductor structure, perpendicular to said plurality of semiconductor heterostructure layers and said active layer, said laser mirrors defining a resonant laser cavity;
a plurality of substantially parallel generation waveguides, disposed in the active layer, with each of said generation waveguides having a predetermined width for generating and amplifying light waves at a given wavelength in response to an electrical forward bias;
a plurality of substantially parallel detecting regions, disposed in the active layer with each detecting region oriented co-axially to a corresponding generation waveguide for measuring the light intensity within said laser cavity;
a plurality of substantially parallel adjustable absorption regions, disposed in the active layer, with each adjustable absorption region oriented co-axially to a corresponding generation waveguide and a corresponding detecting region for tuning the wavelength for said lightwaves generated by said corresponding generation waveguide;
and a plurality of substantially parallel, low-loss, passive waveguides disposed in said active layer, each passive waveguide oriented co-axially to a corresponding generation waveguide, a corresponding detecting region and a corresponding adjustable absorption region and co-extensively coupled to said first laser mirror, said corresponding generation waveguide, said corresponding detecting region, said corresponding adjustable absorption region, and said second laser mirror for guiding lightwaves generated and amplified in said corresponding coupled generation waveguides.

10. The semiconductor laser array of claim 9 further including means, electrically coupled for applying a reverse bias to said adjustable absorption regions.

11. The semiconductor laser array of claim 9 wherein said means for applying different electrical bias to selected regions of said active layer may extend above said plurality of passive waveguides.

12. The semiconductor laser array of claim 9 wherein said adjacent generation waveguides are laterally offset within said active layer, said detecting regions are laterally offset within said active layer, and said adjustable absorption regions are laterally offset within said active layer.

13. A method for optically interconnecting a plurality of discrete functional elements within a semiconductor laser cavity comprising:
defining a resonant laser cavity between first and second laser mirrors;
disposing one or more substantially parallel generation waveguides with a predetermined width and length between said laser mirrors for generating and amplifying lightwaves;
disposing one or more discrete functional elements between the laser mirrors and oriented co-axially to a corresponding generation waveguide for performing a predetermined optical and/or electrical function;
and disposing one or more substantially parallel, low-loss passive waveguides between the laser mirrors and oriented coaxially to a corresponding generation waveguide and other corresponding functional elements and co-extensively coupled to said first and said second laser mirrors, said generation waveguides and/or said discrete functional elements for optically connecting said corresponding generation waveguide and said corresponding functional elements.

14. The method for optically interconnecting a plurality of discrete functional elements within a semiconductor laser cavity of claim 13 wherein said one or more discrete functional elements are detecting regions for measuring the light intensity within said laser cavity.

15. The method for optically interconnecting a plurality of discrete functional elements within a semiconductor laser cavity of claim 13 wherein said one or more discrete functional elements are adjustable absorption regions for tuning the wavelength for said lightwaves generated by said corresponding generation waveguide.

* * * * *